(12) United States Patent
Kouya

(10) Patent No.: US 8,247,702 B2
(45) Date of Patent: Aug. 21, 2012

(54) INTEGRATED CIRCUIT MOUNTED BOARD, PRINTED WIRING BOARD, AND METHOD OF MANUFACTURING INTEGRATED CIRCUIT MOUNTED BOARD

(75) Inventor: Takuya Kouya, Nagoya (JP)

(73) Assignee: Denso Corporation, Kariya-city (JP)

( * ) Notice: Subject to any disclaimer, the term of this patent is extended or adjusted under 35 U.S.C. 154(b) by 240 days.

(21) Appl. No.: 12/702,616

(22) Filed: Feb. 9, 2010

(65) Prior Publication Data

US 2010/0218985 A1 Sep. 2, 2010

(30) Foreign Application Priority Data

Feb. 27, 2009 (JP) .................................. 2009-46631

(51) Int. Cl.
*H05K 1/16* (2006.01)
(52) U.S. Cl. ........ 174/260; 174/261; 174/262; 174/256; 174/257; 174/258; 361/704; 361/761; 257/698; 257/712; 257/737; 257/786; 428/209
(58) Field of Classification Search .......... 174/260–262, 174/256–258; 361/704, 761; 257/698, 712, 257/737, 786; 428/209
See application file for complete search history.

(56) References Cited

U.S. PATENT DOCUMENTS

| | | | | |
|---|---|---|---|---|
| 5,011,884 A | * | 4/1991 | Rosenau et al. | 524/537 |
| 5,433,476 A | * | 7/1995 | Materna et al. | 280/736 |
| 5,729,433 A | * | 3/1998 | Mok | 361/704 |
| 6,025,650 A | * | 2/2000 | Tsuji et al. | 257/786 |
| 6,518,162 B2 | | 2/2003 | Ono et al. | |
| 7,545,241 B2 | | 6/2009 | Wakabayashi et al. | |
| 2001/0018948 A1 | * | 9/2001 | Tada et al. | 156/228 |
| 2003/0090883 A1 | * | 5/2003 | Asahi et al. | 361/761 |
| 2003/0178227 A1 | * | 9/2003 | Matsunaga et al. | 174/257 |
| 2004/0145044 A1 | * | 7/2004 | Sugaya et al. | 257/698 |
| 2005/0281995 A1 | * | 12/2005 | Murai et al. | 428/209 |
| 2006/0269868 A1 | * | 11/2006 | Hasegawa et al. | 430/270.1 |
| 2007/0124924 A1 | * | 6/2007 | Nakamura | 29/830 |
| 2008/0078570 A1 | * | 4/2008 | Japp et al. | 174/256 |
| 2008/0284001 A1 | * | 11/2008 | Mori et al. | 257/712 |
| 2008/0284012 A1 | * | 11/2008 | Okayama et al. | 257/737 |
| 2009/0133915 A1 | * | 5/2009 | Higashitani | 174/261 |

(Continued)

FOREIGN PATENT DOCUMENTS

JP 58-68954 A 4/1983

(Continued)

OTHER PUBLICATIONS

Office Action mailed on Dec. 14, 2010 issued from the Japan Patent Office in the corresponding Japanese patent application No. 2009-046631 (and English translation).

*Primary Examiner* — Xiaoliang Chen
(74) *Attorney, Agent, or Firm* — Posz Law Group, PLC

(57) ABSTRACT

An integrated circuit mounted board includes a printed wiring board and an integrated circuit bare chip mounted on the printed wiring board. The printed wiring board includes a metal base, an insulating member made of an insulating material and disposed on the metal base, and a wiring pattern disposed on the insulating member. The wiring pattern includes an electrode part to which the integrated circuit bare chip is electrically coupled. The insulating member includes an under region being opposite to the electrode part. The metal base includes a metal substrate and a metal portion protruding from the metal substrate. The metal portion is buried in the under region of the insulating member.

6 Claims, 10 Drawing Sheets

U.S. PATENT DOCUMENTS

2009/0288863 A1 * 11/2009 Kim et al. .................. 174/258

FOREIGN PATENT DOCUMENTS

| | | |
|---|---|---|
| JP | 04-159792 A | 6/1992 |
| JP | 07-323501 A | 12/1995 |
| JP | 07-326848 A | 12/1995 |
| JP | 08-228053 A | 9/1996 |
| JP | 2005-247953 A | 9/2005 |
| JP | 2007-129039 A | 5/2007 |

* cited by examiner

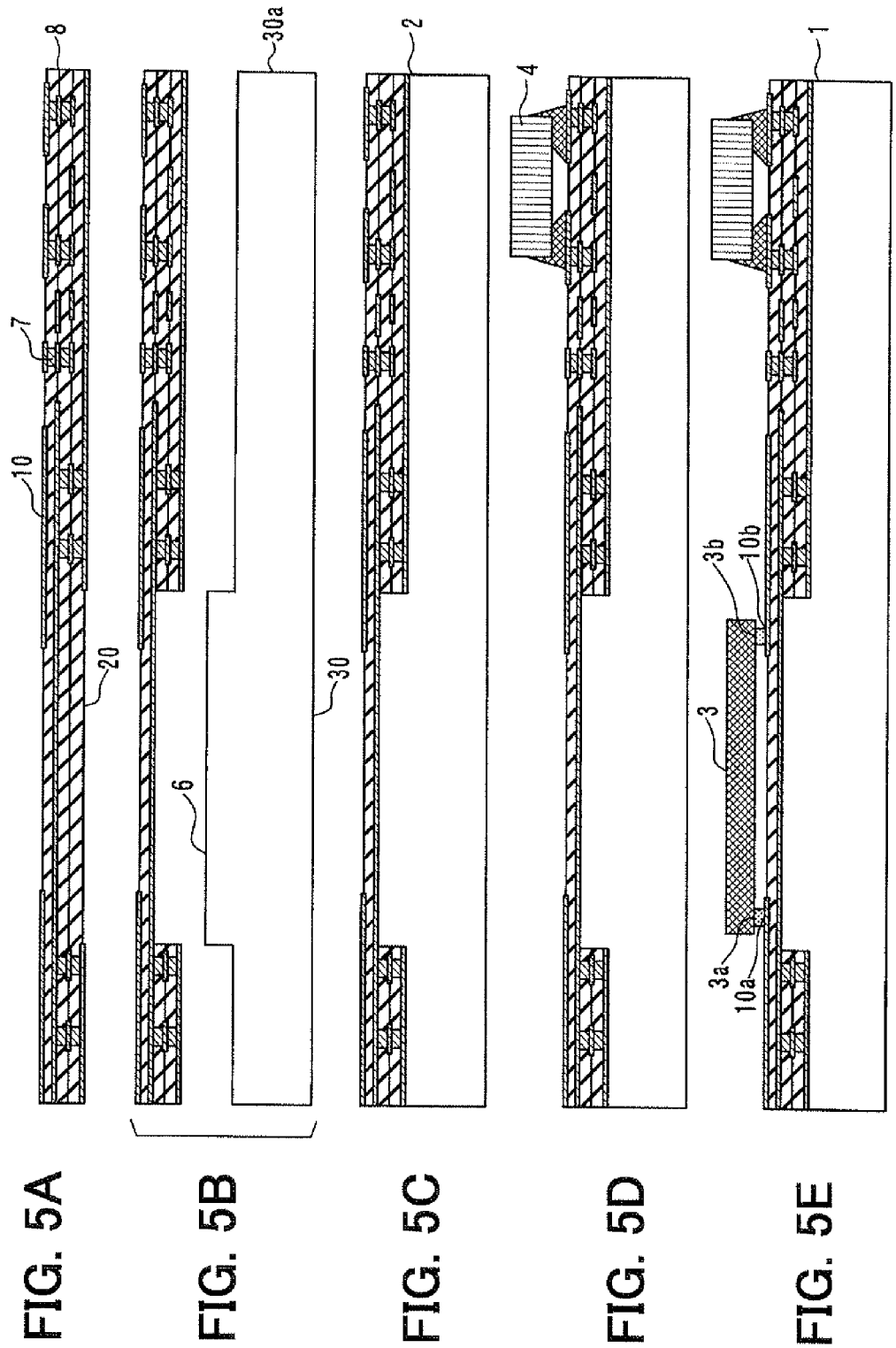

INTEGRATED CIRCUIT MOUNTED BOARD, PRINTED WIRING BOARD, AND METHOD OF MANUFACTURING INTEGRATED CIRCUIT MOUNTED BOARD

CROSS REFERENCE TO RELATED APPLICATIONS

The present application is based on and claims priority to Japanese Patent Application No. 2009-46631 filed on Feb. 27, 2009, the contents of which are incorporated in their entirety herein by reference.

BACKGROUND OF THE INVENTION

1. Field of the Invention

The present invention relates to an integrated circuit mounted board, a printed wiring board, and a method of manufacturing an integrated circuit mounted board.

2. Description of the Related Art

In a conventional integrated circuit mounted board, a bare chip of an integrated circuit made of semiconductor such as, for example, silicon is mounted on a printed wiring board. In the printed circuit board, insulating layers made of an insulating material and a wiring pattern including conductive lines made of, for example, copper are disposed on a metal base.

In a general method of manufacturing the integrated circuit mounted board, a wire bonding connection or a flip-chip connection may be performed. In the wire bonding connection, pads of the bare chip and electrodes of the wiring pattern are bonded through conductive wires. In the flip-chip connection, the integrated circuit is bonded on the printed wiring board through bumps formed on pads of the bare chip.

When gold is used as the conductive wires or the bumps (hereafter, called connecting medium) in the wire bonding connection or the flip-chip connection, an ultrasonic wave thermocompression method may be used. In the ultrasonic wave thermocompression method, the printed wiring board is mounted on a heat stage (ceramic or metal) heated at a temperature from 150° C. to 200° C. and an ultrasonic wave vibration is applied to the connecting medium on the printed wiring board.

In an integrated circuit mounted board, glass epoxy resin or a phenol paper is commonly used as an insulating material. When an integrated circuit mounted board is used for dealing a high frequency signal such as millimeter wave, fluorine resin such as, for example, polytetrafluoroethylene (PTFE) having a lower dielectric loss tangent than the above-described insulating material can be used as described, for example, in JP-A-7-323501. By using an insulating material having a low dielectric loss tangent, energy loss (dielectric loss) which is proportional to a signal frequency and the dielectric loss tangent can be restricted.

An elastic modulus of an insulating material such as, for example, fluorine resin and liquid crystal polymer (LCP) suitably used for dealing high frequency may drastically reduce at a high temperature from 150° C. to 200° C.

Thus, when the wire bonding connection and the flip-chip bonding is performed during a manufacturing process of the integrated circuit mounted board, the insulating material included in the printed wiring board on the heat stage may disperse ultrasonic wave and load applied to the connecting medium. As a result, the wire bonding connection or the flip-chip connection may be improperly performed, and a reliability of the integrated circuit mounted board may be reduced.

SUMMARY OF THE INVENTION

In view of the foregoing problems, it is a first object of the present invention to provide an integrated circuit mounted board in which an integrated circuit bare chip can be electrically coupled with a printed wiring board with certainty. A second object of the present invention is to provide a printed wiring board to which an integrated circuit bare chip can be electrically coupled with certainty. A third object of the present invention is to provide a method of manufacturing method of an integrated circuit mounted board in which an integrated circuit bare chip can be electrically coupled with a printed wiring board with certainty.

According to a first aspect of the present invention, an integrated circuit mounted board includes a printed wiring board and an integrated circuit bare chip mounted on the printed wiring board. The printed wiring board includes a metal base, an insulating member made of an insulating material and disposed on the metal base, and a wiring pattern disposed on the insulating member. The wiring pattern includes an electrode part to which the integrated circuit bare chip is electrically coupled. The insulating member includes an under region being opposite to the electrode part. The metal base includes a metal substrate and a metal portion protruding from the metal substrate. The metal portion is buried in the under region of the insulating member.

In the above-described integrated circuit mounted board, the integrated circuit bare chip can be electrically coupled with the printed wiring board with certainty.

According to a second aspect of the present invention, a printed wiring board includes a metal base, an insulating member, and a wiring pattern. The metal base includes a metal substrate and a metal portion protruding from the metal substrate. The insulating member is made of an insulating material and disposed on the metal base. The wiring pattern is disposed on the insulating member and includes an electrode part configured to be electrically coupled with an integrated circuit bare chip. The insulating member includes an under region being opposite to the electrode part. The metal portion is buried in the under region.

The above-described printed wiring board can be electrically coupled with an integrated circuit bare chip with certainty.

In a method according to a third aspect of the present invention, an integrated circuit mounted board including a printed wiring board and an integrated circuit bare chip mounted on the printed wiring board is manufactured. The printed wiring board includes a metal base, a plurality of insulating layers, and a wiring pattern. The metal base includes a metal substrate and a metal portion protruding from the metal substrate. The plurality of insulating layers is made of an insulating material and is disposed on the metal base. The wiring pattern is disposed on the plurality of insulating layers and includes an electrode part to which the integrated circuit bare chip is electrically coupled. The plurality of insulating layers includes a first insulating layer on which the electrode part is disposed and a second insulating layer disposed on an opposite side of the first insulating layer from the electrode part. The plurality of insulating layers also includes an under region being opposite to the electrode part. In the method according to the third aspect, a cavity is formed in the under region so that the cavity penetrates the plurality of insulating layers from a surface of the plurality of insulating layers on an opposite side from the electrode part to a surface of the second insulating layer adjacent to the first insulating layer, and the plurality of insulating layers is disposed on the metal base in such a manner that the metal portion is fitted into the cavity.

In the above-described manufacturing method, the metal portion can be buried in the plurality of insulating layers. Thus, the integrated circuit bare chip can be electrically coupled with the printed wiring board with certainty.

BRIEF DESCRIPTION OF THE DRAWINGS

Additional objects and advantages of the present invention will be more readily apparent from the following detailed description of exemplary embodiments when taken together with the accompanying drawings. In the drawings:

FIG. 5A to FIG. 5E are diagrams illustrating exemplary processes of manufacturing the integrated circuit mounted board 1 according to the second embodiment;

DETAILED DESCRIPTION OF THE EXEMPLARY EMBODIMENTS

Figure 1:
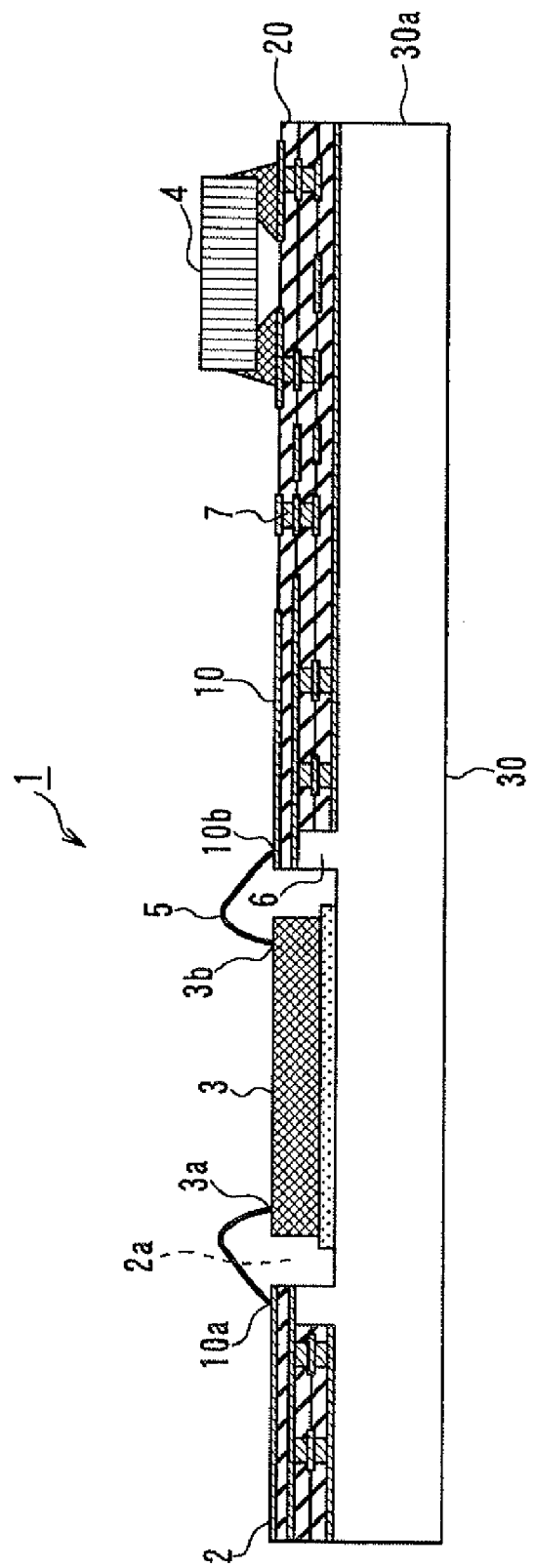
FIG. 1 is a diagram illustrating a cross-sectional view of an integrated circuit mounted board according to a first embodiment of the present invention.

Firstly, various aspects of the present invention will be described before describing exemplary embodiments of the present invention.

According to a first aspect of the present invention, an integrated circuit mounted board includes a printed wiring board and an integrated circuit (IC) bare chip mounted on the printed circuit board. The printed wiring board is made by forming a wiring pattern on an insulating member made of an insulating material and disposing the insulating member on a metal base. The metal base includes a metal substrate and a metal portion protruding from the metal substrate. The printed wiring board and the IC bare chip are electrically coupled with each other. The wiring pattern includes an electrode part to which the IC bare chip is electrically coupled.

At a region in the insulating member opposing the electrode part of the wiring pattern (hereafter, called an under region), the metal portion protruding from the metal substrate is buried. When a thickness direction of the insulating member is expressed as Z-axis direction, the under region is a predetermined region in the insulating member located under the electrode part in the Z-axis direction.

In the integrated circuit mounted board, a rigidity of the under region in the insulating member is enhanced by the metal portion. Thus, when the IC bare chip and the wiring pattern are coupled through a connecting medium such as, for example, a conductive wire and a bump, an ultrasonic wave and a load applied to the printed wiring board are facilitated to be transmitted in the Z-axis direction.

Regardless of the insulating material of the insulating member, the connecting medium can be thermally fusion-bonded to the electrode part with certainty due to the metal portion having a higher rigidity than the insulating material. Therefore, the IC bare chip can be electrically coupled with the printed wiring board with certainty.

The insulating material of the insulating member may be thermoplastic resin. For example, the insulating material may be fluorine resin such as, for example, PTFE, a plastic resin such as, for example, polyether ether ketone (PEEK), and liquid crystal polymer (LCP) which generally have lower dielectric loss tangent than glass epoxy and phenol paper.

The integrated circuit mounted board can restrict energy loss (dielectric loss) which is proportional to a signal frequency and the dielectric loss tangent. Therefore, the integrated circuit can be suitably used for a device that deals a high frequency signal such as, for example, millimeter wave.

In a case where the electrode part includes a plurality of electrodes, the under region may include one region being opposite to all of the electrodes or the under region may include a plurality of regions each being opposite to one of the electrodes.

When the under region includes the plurality of regions, an area of the metal portion buried in the insulating member can be reduced. Thus, a wiring density of the wiring pattern formed on the insulating member can be increased when the wiring pattern includes a plurality of patterns or when the wiring pattern has a microstrip line structure.

The printed wiring board may be a multilayer printed circuit board in which the insulating member includes a plurality of insulating layers, the wiring pattern includes a plurality of wiring layers, and each of the wiring layers is disposed on one of the insulating layers. In such a case, an area of the printed wiring board can be reduced.

When a thickness of the insulating layers is reduced, a dispersion of the ultrasonic wave and the load during a thermal fusion bonding can be restricted. Thus, in the plurality of insulating layers, when an insulating layer on which the electrode portion is formed is called as a first insulating layer and an insulating layer formed on an opposite side of the first insulating layer from the electrode part is called as a second insulating layer, the metal portion may be buried in all the plurality of insulating layers including the second insulating layer except for the first insulating layer. That is, the metal portion may penetrate the plurality of insulating layers from a surface of the plurality of insulating layers adjacent to the metal base to a surface of the second insulating layer adjacent to the first insulating layer.

A thickness of the first insulating layer may be less than a thickness of an insulating layer in the plurality of insulating layers other than the first insulating layer. For example, when the first insulating layer has a first thickness and the second insulating layer has a second thickness, the first thickness may be less than the second thickness.

By reducing the thickness of the first insulating layer, the dispersion of the ultrasonic wave and the load during the thermal fusion bonding can be restricted. Thus, the IC bare chip can be electrically coupled with the printed wiring board with certainty.

In a case where the wiring pattern has a microstrip line structure, when the thickness of the insulating layer is reduced, a width of a signal line is required to be reduced in order to set a characteristic impedance of the printed wiring board to a predetermined value (for example, 50Ω). If the width of the signal line is too small, a conductive loss of the strip line may increase, and a loss of the whole circuit may increase.

In the multilayer printed wiring board, the wiring pattern may have a microstrip line structure and the plurality of wiring layers may include a strip line pattern layer and two ground pattern layers. In the plurality of insulating layers, the signal line layer may be formed on a surface of the first insulating layer on which the electrode part is formed (first surface). On a surface of the first insulating layer adjacent to the second insulating layer (second surface), one of the ground pattern layers may be formed only at a portion corresponding to the under region. On a surface of the second insulating layer on an opposite side from first insulating layer (third surface), the other one of the ground pattern layers may be formed. The ground pattern layer disposed on the second surface and the ground pattern layer disposed on the third surface may be coupled through a via plug penetrating through the second insulating layer.

The above-described integrated circuit mounted board is substantially similar to a case where a thickness of the first insulating layer is reduced only at a portion corresponding to the under region. Thus, the IC bare chip can be electrically coupled with the printed wiring board with certainty. In addition, by securing sufficient thicknesses of the other insulating layers, the conductive loss of the strip line can be restricted without reducing the width of signal lines unnecessary.

In a case where a supplementing material is previously included in the insulating material of the insulating member so that a linear expansion coefficient of the insulating member is substantially similar to a linear expansion coefficient of the wiring pattern, the metal substrate and metal portion may be made of a material having a linear expansion coefficient similar to that of the wiring pattern. For example, the metal substrate and the metal portion may be made of the same material with the wiring pattern. The supplementing material may be an insulating material having a low linear expansion coefficient such as, for example, a glass cloth. The insulating member including the supplementing material, the wiring pattern, the metal substrate, and the metal portion are not required to have strictly the same linear expansion coefficient.

In the above-described integrated circuit mounted board, peeling off of the printed wiring board and the metal base can be restricted. In addition, peeling off of the wiring pattern and the insulating member can be restricted.

A printed wiring board according to a second aspect of the present invention includes an insulating member, a wiring pattern disposed on the insulating member, and a metal base on which the insulating member is disposed. The wiring pattern includes an electrode part configured to be electrically coupled with an integrated circuit bare chip. The metal base includes a metal substrate and a metal portion protruding from the metal substrate. The insulating member includes an under region being opposite to the electrode part. The metal portion is buried in the under region of the insulating member. The above-described printed circuit board can be suitably used for the integrated circuit mounted board according to the first aspect of the present invention.

A manufacturing method according to a third aspect of the present invention is a method of manufacturing an integrated circuit mounted board in which an integrated circuit bare chip is mounted on a multilayer printed wiring board, and the IC bare chip and the multilayer printed wiring board are electrically coupled with each other. The multilayer printed wiring board includes a plurality of insulating layers made of an insulating material, a wiring pattern formed on the plurality of insulating layers, and a metal base on which the plurality of insulating layers are disposed. The wiring pattern includes an electrode part to which the integrated circuit bare chip is electrically coupled. The plurality of insulating layers include a first insulating layer on which the electrode part is disposed and a second insulating layer disposed on an opposite side of the first insulating layer from the electrode part.

The plurality of insulating layers also include an under region being opposite to the electrode part. In the manufacturing method, a cavity is formed in the under region so that the cavity penetrates the plurality of insulating layers from a surface of the plurality of insulating layers on an opposite side from the electrode part to a surface of the second insulating layer adjacent to the first insulating layer, and the plurality of insulating layers is disposed on the metal base in such a manner that the metal portion is fitted into the cavity.

In the above-described manufacturing method of the integrated circuit mounted board, the metal base can be buried in the plurality of insulating layers. Thus, the integrated circuit bare chip can be electrically coupled with the multilayer printed wiring circuit with certainty.

First Embodiment

An integrated circuit mounted board 1 according to a first embodiment of the present invention will be described with reference to FIG. 1 and FIG. 2.

Figure 2A:
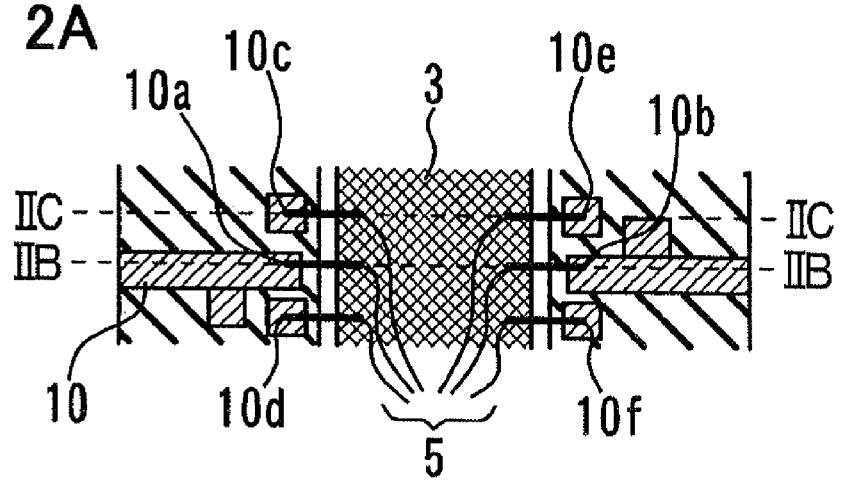
FIG. 2A is a diagram illustrating a top view of the integrated circuit mounted board according to the first embodiment.

As illustrated in FIG. 1, the integrated circuit mounted board 1 includes a metal base 30, a multilayer printed wiring board 2, an integrated circuit (IC) bare chip 3, and a chip part 4. In the multilayer printed wiring board 2, a wiring pattern 10 made of copper is formed. The wiring pattern 10 includes a plurality of wiring layers which are stacked. The IC bare chip 3 is made of a semiconductor such as, for example, silicon. The chip part 4 includes, for example, a capacitor and a resistor. The IC bare chip 3 and the chip part 4 are mounted on a surface of the multilayer printed wiring board 2.

The IC bare chip 3 and the surface of the multilayer printed wiring board 2 are electrically coupled with each other through conductive wires 5 made of, for example, gold or copper. The metal base 30 includes a copper substrate 30a and a copper portions 6 protruding from the copper substrate 30a. The metal base 30 can be used as, for example, a heat sink.

The IC bare chip 3 is a semiconductor element not being packaged. The multilayer printed wiring board 2 has a recess portion 2a. The IC bare chip 3 is disposed on the recess portion 2a through an adhesive such as, for example, silver epoxy resin and silicone resin. The IC bare chip 3 includes pads 3a and 3b to which the conductive wires 5 are bonded.

The multilayer printed wiring board 2 includes an insulating member made of an insulating material. The insulating member includes a plurality of insulating layers 20. Each of the insulating layers 20 may be a prepreg made by impregnating a glass cloth with polytetrafluoroethylene (PTFE). The glass cloth can function as a supplementing material. Each of the wiring layers is formed on one of the insulating layers 20. The insulating layers 20 are disposed on the metal base 30. The glass cloth is included in the insulating layers 20 at a ratio in accordance with an impregnating amount of PTFE so that a linear expansion coefficient of the insulating layers 20 is substantially similar to a linear expansion coefficient of the wiring pattern 10.

In the multilayer printed circuit board 2 according to the present embodiment, the wiring pattern 10 has a microstrip line structure. Widths of signal lines and distances between the signal lines and ground lines are determined in such a manner that a characteristic impedance of the multilayer printed wiring board 2 becomes a predetermined value. The predetermined value is, for example, 50Ω. The wiring pattern 10 includes electrodes 10a and 10b on the signal lines and ground pads 10c-10f. The conductive wires 5 are bonded to the electrodes 10a and 10b and the ground pads 10c-10f. The electrodes 10a and 10b and the ground pads 10c-10f can function as an electrode part.

Figure 2B:
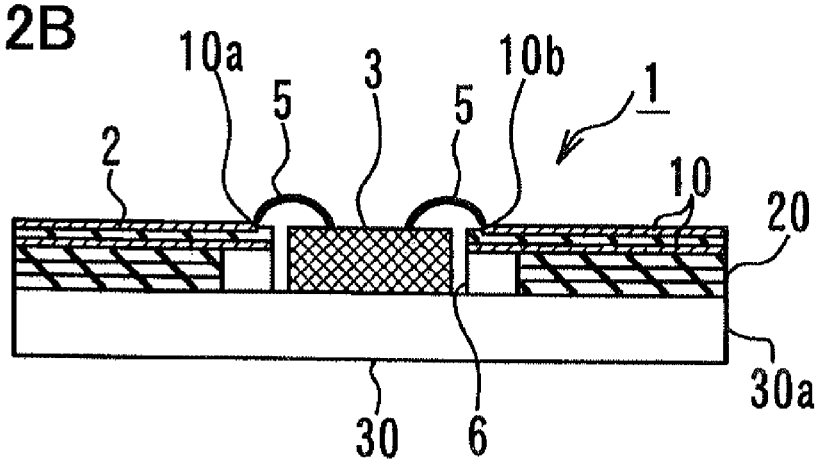
FIG. 2B is a diagram illustrating a cross-sectional view of the integrated circuit mounted board taken along line IIB-IIB in FIG. 2A.
Figure 2C:
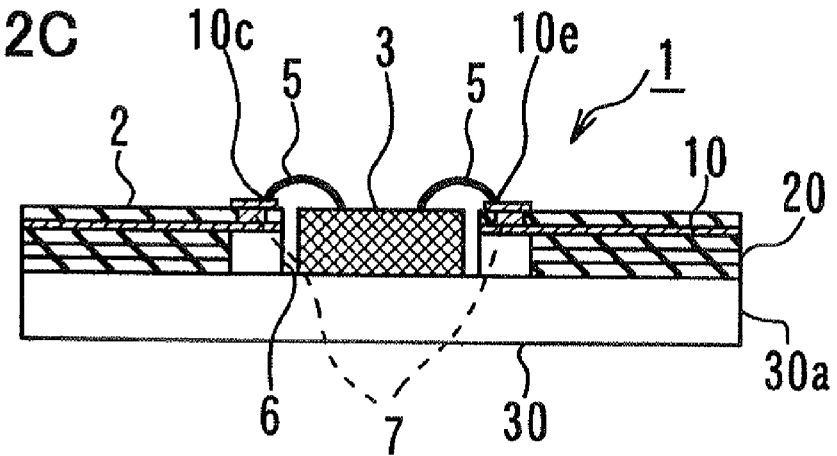
FIG. 2C is a diagram illustrating a cross-sectional view of the integrated circuit mounted board taken along line IIC-IIC in FIG. 2A.

The insulating layers 20 include first to third insulating layers 20. The first insulating layer 20, the second insulating layer 20, and the third insulating layers 20 are arranged in a thickness direction in this order from a side where the electrodes 10a and 10b and the ground pads 10c-10f are disposed. The copper portions 6 of the metal base 30 are respectively provided at regions of the second insulating layer 20 and the third insulating layer 20 located under the electrodes 10a and 10b and the ground pads 10c-10f (hereafter, called under regions), as illustrated in FIG. 2B.

Each of the under regions of the insulating layers 20 is opposite to one of the electrodes 10a and 10b and the ground pads 10c-10f. At regions of the first insulating layer 20 located under the ground pads 10c-10f, via plugs 7 are respectively provided. At interlayers of the insulating layers 20, via plugs 7 are also provided so as to electrically couple the signal lines or the ground lines formed on different insulating layers 20.

An exemplary method of manufacturing the integrated circuit mounted board 1 will be described with reference to FIG. 3A to FIG. 3E. In a manufacturing process illustrated in FIG. 3A to FIG. 3E, a built-up method is used.

Figure 3A:
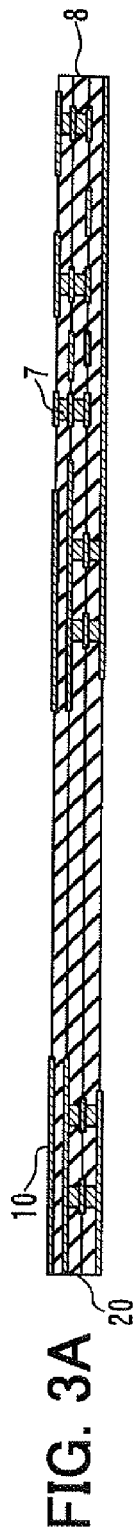
FIG. 3A to FIG. 3E are diagrams illustrating exemplary processes of manufacturing the integrated circuit mounted board 1 according to the first embodiment.

During a process illustrated in FIG. 3A, through holes are provided in the prepregs, for example, by using a laser device. Each of the through holes are filled with a conductive paste, and thereby the prepregs with the via plugs 7 are formed. Then, copper thin films are attached on both sides of one of the prepregs with the via plugs 7, for example, by laminate pressing or heat pressing using a roll laminating machine. The copper thin films are etched so as to form the wiring layers on the insulating layer 20. The insulating layer 20, on which the wiring layers are formed, is disposed between two prepregs with the via plugs 7, and the two prepregs and the insulating layer 20 are disposed between two copper thin films. The two copper thin films, the two prepregs and the insulating layer 20 are bonded to each other by heat pressing. Then, the two copper thin films located on both sides are etched so as to form the wiring layers. As a result, the base substrate 8 including three insulating layers 20 and four wiring layers is formed.

A manufacturing method of the base substrate 8 is not limited to the above-described example. For example, one copper thin film may be attached to one side of each of prepregs, the copper thin film may be etched so as to form the wiring layers, the through holes may be filled with the conductive member so as to form the via plugs 7, and the prepregs may be stacked and pressed. Other built-up methods may also be used. The number of the insulating layers 20 and the number of the wiring layers may be changed. For example, more than three insulating layers 20 and more than four wiring layers may be formed.

Figure 3B:
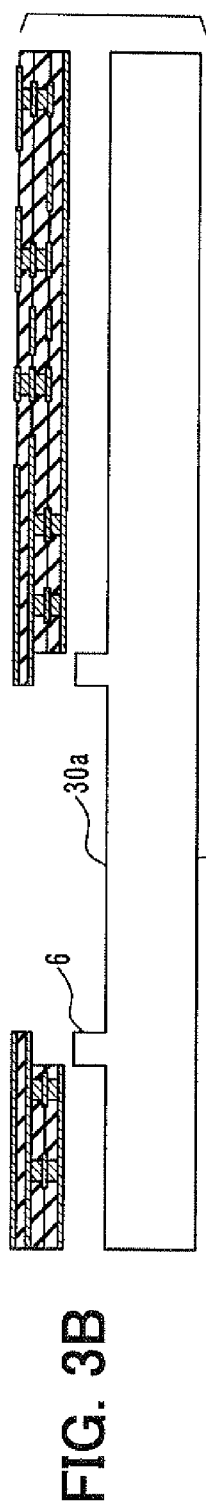
Figure 3C:
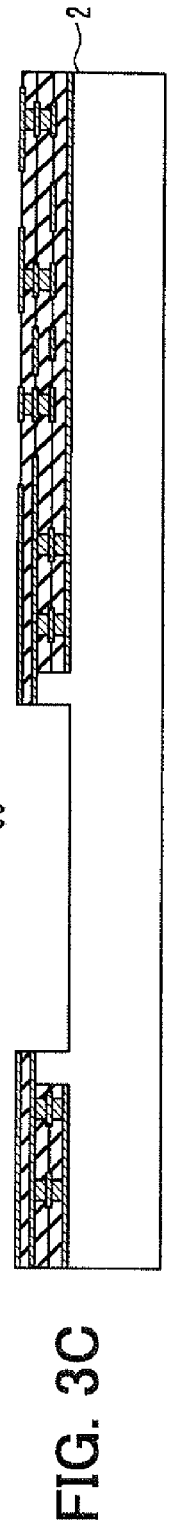

During processes illustrated in FIG. 3B and FIG. 3C, a through hole corresponding to the recess portion 2a is provided through first to third insulating layers 20 of the base substrate 8, for example, using a laser device. Then, a plurality of cavities having a predetermined width is provided in the second insulating layer 20 and the third insulating layer 20 so as to be adjacent to the through holes. Then, the base substrate 8 and the metal base 30 are bonded to each other in such a manner that each of the copper portions 6 is fitted into one of the cavities, and thereby the multilayer printed wiring board 2 is formed. In the metal base 30, the copper substrate 30a and the copper portions 6 are integrally formed, for example, by die casting or pressing. In the die casting, melted copper is poured into a die with pressure and is solidified. The base substrate 8 and the metal base 30 are bonded to each other through a conductive adhesive.

Figure 3D:
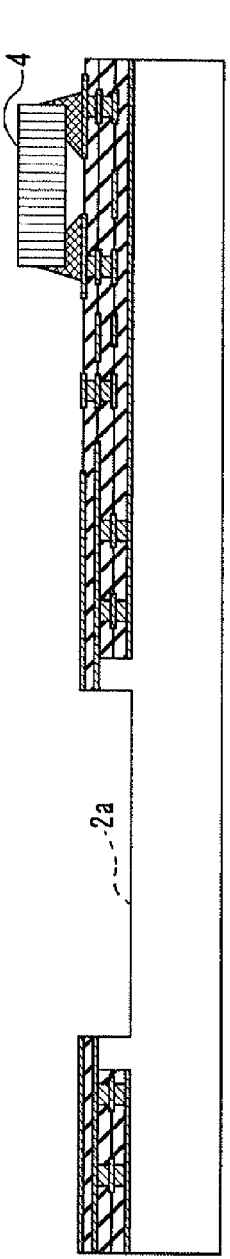
Figure 3E:
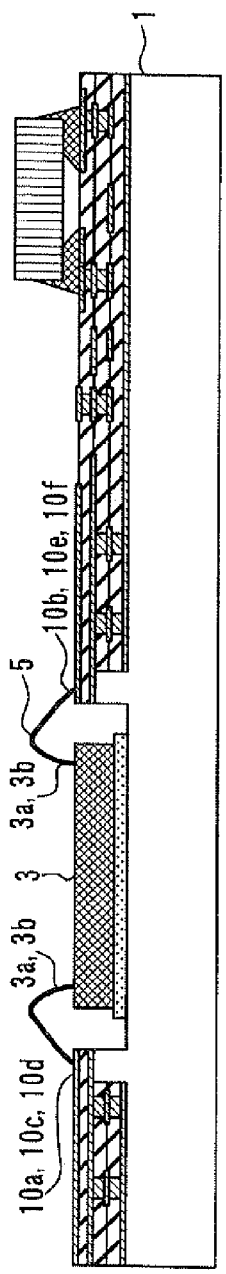

During a process illustrated in FIG. 3D, the chip part 4 such as, for example, a capacitor and a resistor is soldered on a predetermined portion of the signal lines and the ground lines on the surface of the multilayer printed wiring board 2. During a process illustrated in FIG. 3E, the IC bare chip 3 is bonded to the recess portion 2a of the multilayer printed wiring board 2 with the adhesive such as, for example, silver epoxy resin or silicone resin. The multilayer printed wiring board 2 including the IC bare chip 3 is disposed on the heat stage heated at a temperature from 150° C. to 200° C. Then, the pads 3a of the IC bare chip 3 and the electrodes 10a, 10b on the surface of the multilayer printed wiring board 2 are bonded through the conductive wires 5 made of, for example, gold or copper with a bonding tool. In addition, the pads 3b of the IC bare chip 3 and the ground pads 10c-10f on the surface of the multilayer printed wiring board 2 are bonded through the conductive wires 5.

In the integrated circuit mounted board 1 according to the present embodiment, the copper portions 6 are provided at the under regions of the electrodes 10a and 10b and the ground pads 10c-10f. Thus, even if an ultrasonic wave and a load applied to the multilayer printed wiring board 2 when the pads 3a and 3b of the IC bare chip 3 and the electrodes 10a and 10b and the ground pads 10c-10f are bonded, the copper portions 6 can restrict a dispersion of the ultrasonic wave and the load. Thus, the conductive wires 5 can be thermally fusion-bonded to the electrodes 10a and 10b and the ground pads 10c-10f with certainty.

The integrated circuit mounted board 1 manufactured by the above-described method, the IC bare chip 3 is improperly coupled with the multilayer printed wiring board 2. Thus, a reliability of the integrated circuit mounted board 1 can be improved. In the integrated circuit mounted board 1, the insulating layers 20 of the multilayer printed wiring board 2 include PTFE which has a lower dielectric loss tangent than glass epoxy resin. Therefore, the integrated circuit mounted board 1 can restrict a dielectric loss, and can be suitably used for a device which deals a high frequency signal such as, for example, millimeter wave.

In the integrated circuit mounted board 1, the copper portions 6 of the metal base 30 are respectively provided at the under regions of the insulating layers 20. Thus, an area of the copper portions 6 in the insulating layers 20 can be reduced, and a density of the wiring pattern 10 in the insulating layers 20 can be increased.

Furthermore, in the integrated circuit mounted board 1, the glass cloth is previously included in PTFE so that the linear expansion coefficient of the insulating layers 20 is substantially similar to the linear expansion coefficient of the wiring pattern 10, and the copper portions 6 in the metal base 30 and the wiring pattern 10 are made of the same material. Thus, peeling off of the wiring pattern 10 from the metal base 30 can be restricted. In addition, peeling off of the wiring pattern 10 from the insulating layers 20 can be restricted.

Second Embodiment

Figure 4:
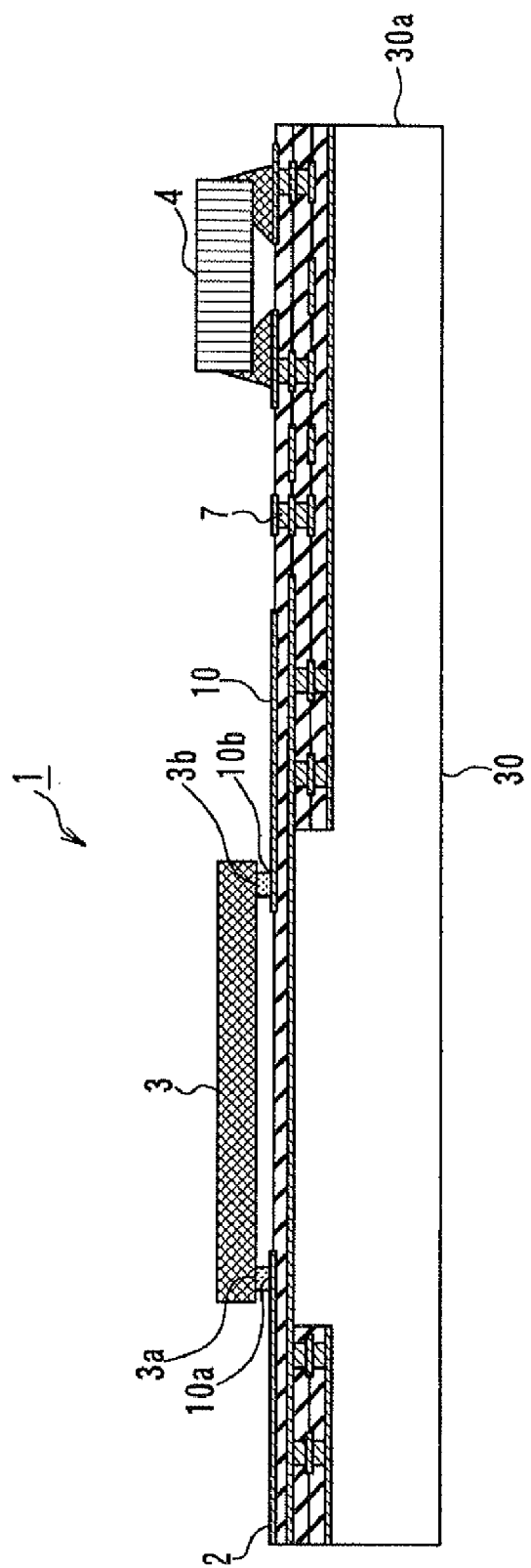
FIG. 4 is a diagram illustrating a cross-sectional view of an integrated circuit mounted board according to a second embodiment of the present invention.
Figure 6A:
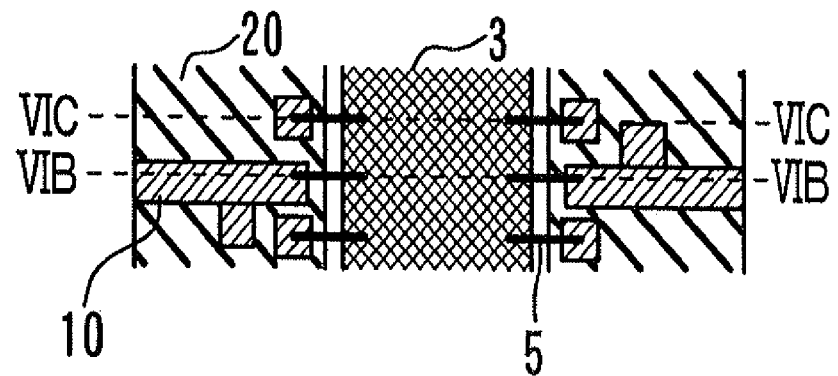
FIG. 6A is a diagram illustrating a top view of the integrated circuit mounted board according to another embodiment of the present invention.
Figure 6B:
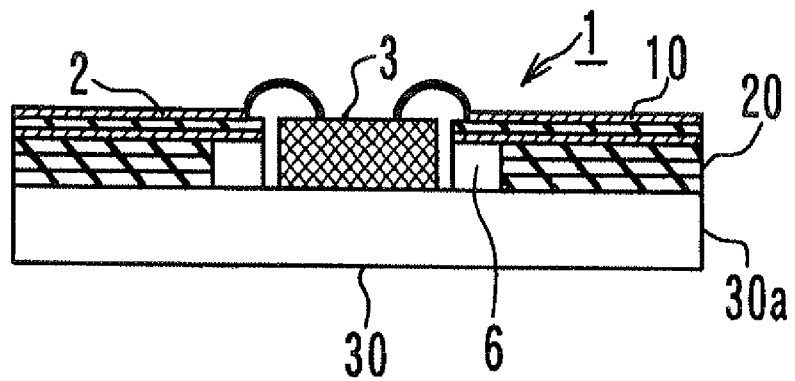
FIG. 6B is a diagram illustrating a cross-sectional view of the integrated circuit mounted board taken along line VIB-VIB in FIG. 6A.
Figure 6C:
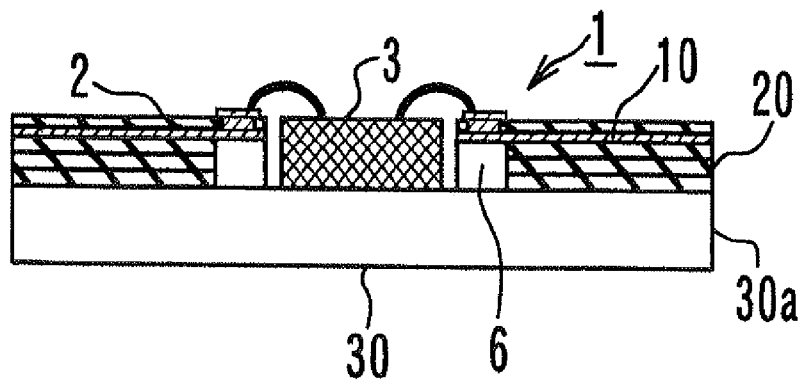
FIG. 6C is a diagram illustrating a cross-sectional view of the integrated circuit mounted board taken along line VIC-VIC in FIG. 6A.
Figure 7A:
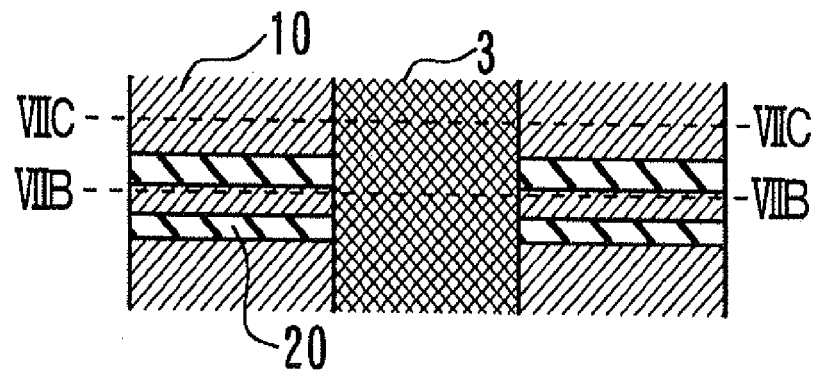
FIG. 7A is a diagram illustrating a top view of the integrated circuit mounted board according to another embodiment of the present invention.
Figure 7B:
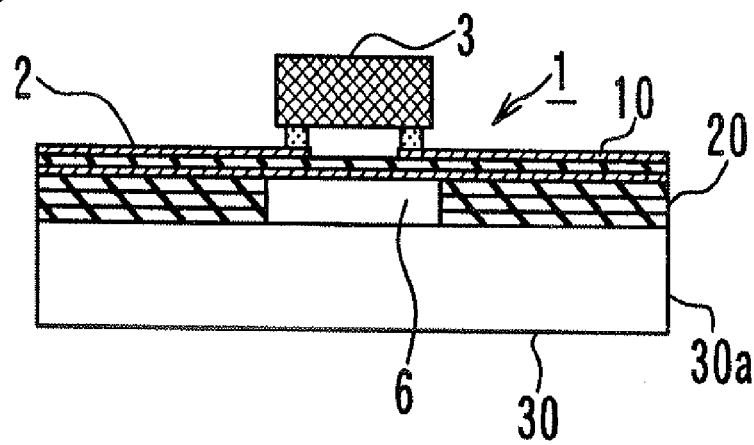
FIG. 7B is a diagram illustrating a cross-sectional view of the integrated circuit mounted board taken along line VIIB-VIIB in FIG. 7A.
Figure 7C:
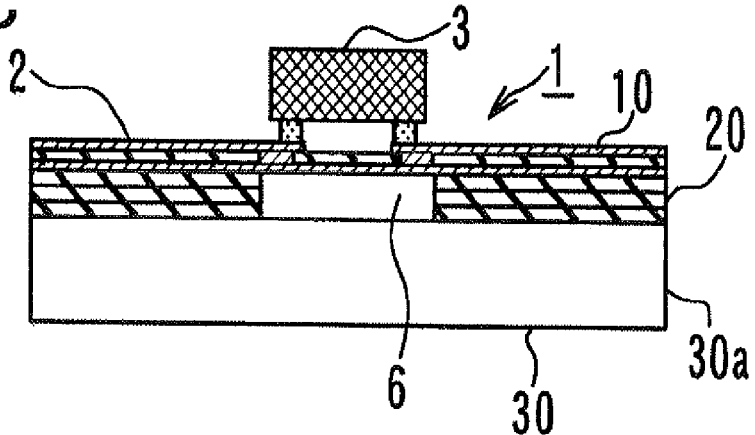
FIG. 7C is a diagram illustrating a cross-sectional view of the integrated circuit mounted board taken along line VIIC-VIIC in FIG. 7A.
Figure 8A:
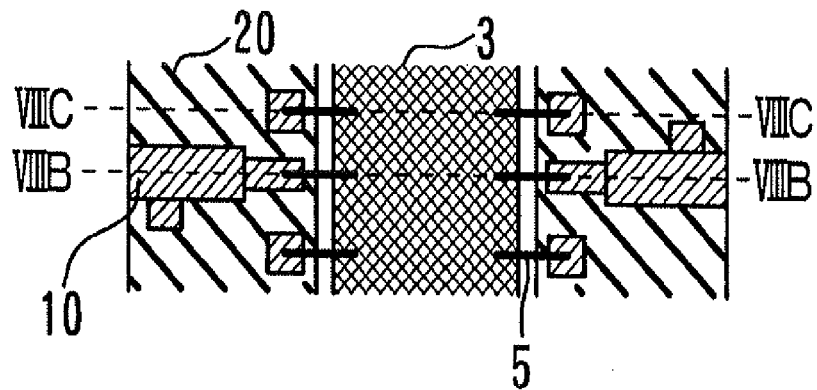
FIG. 8A is a diagram illustrating a top view of the integrated circuit mounted board according to another embodiment of the present invention.
Figure 8B:
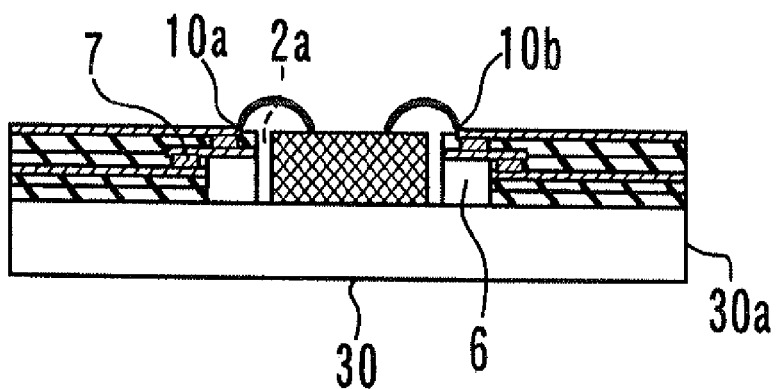
FIG. 8B is a diagram illustrating a cross-sectional view of the integrated circuit mounted board taken along line VIIIB-VIIIB in FIG. 8A.
Figure 8C:
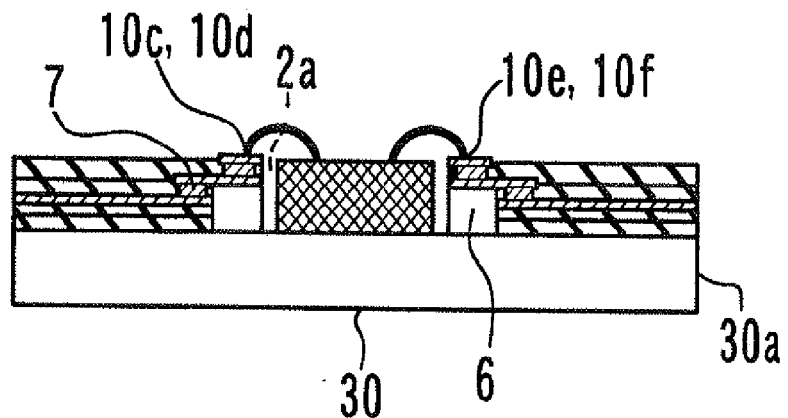
FIG. 8C is a diagram illustrating a cross-sectional view of the integrated circuit mounted board taken along line VIIIC-VIIIC in FIG. 8A.
Figure 9A:
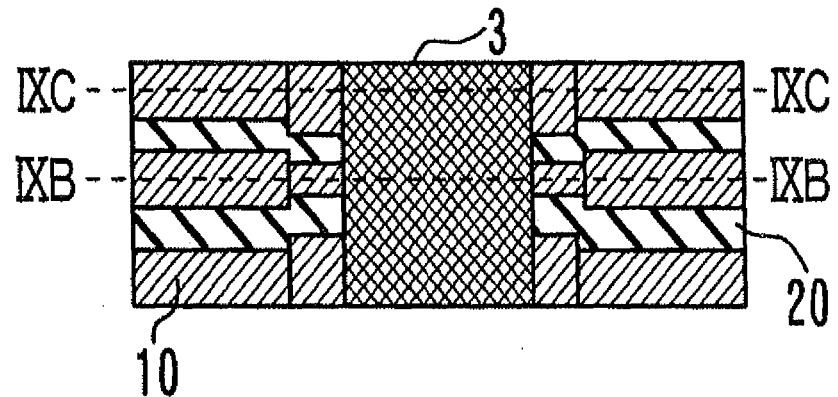
FIG. 9A is a diagram illustrating a top view of the integrated circuit mounted board according to another embodiment of the present invention.
Figure 9B:
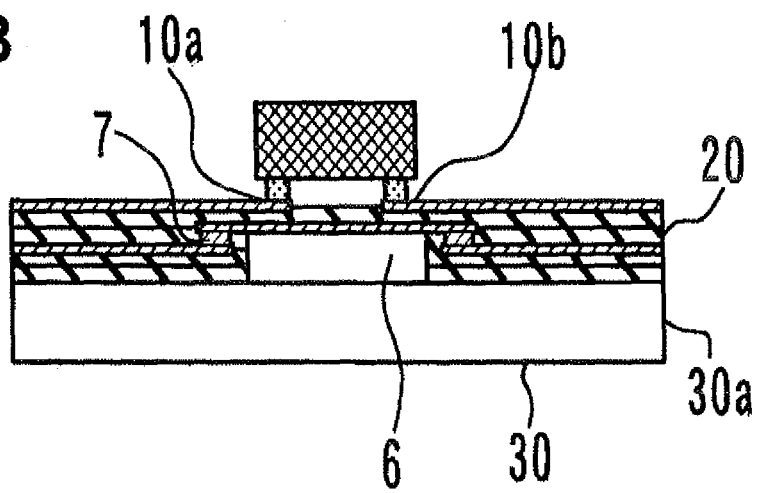
FIG. 9B is a diagram illustrating a cross-sectional view of the integrated circuit mounted board taken along line IXB-IXB in FIG. 9A.
Figure 9C:
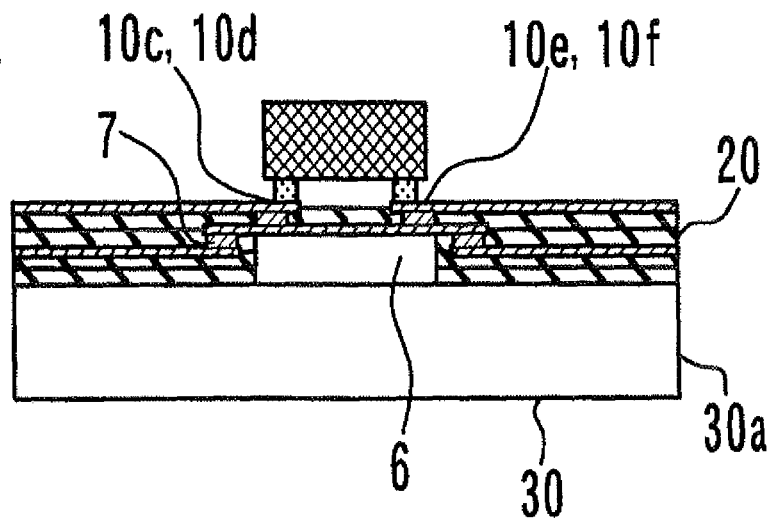
FIG. 9C is a diagram illustrating a cross-sectional view of the integrated circuit mounted board taken along line IXC-IXC in FIG. 9A.

An integrated circuit mounted board 1 according to a second embodiment of the present invention will be described with reference to FIG. 4.

The integrated circuit mounted board 1 includes the multilayer printed wiring board 2, the IC bare chip 3, and the chip part 4 such as, for example, a capacitor and a resistor. The electrodes 10a and 10b are formed on the surface of the multilayer printed wiring board 2. The IC bare chip 3 has the pads 3a and 3b. The electrodes 10a and 10b of the multilayer printed wiring board 2 are electrically coupled with the pads 3a and 3b of the IC bare chip 3, respectively, through bumps formed on the pads 3a and 3b. The bumps may be made of gold or copper, for example. The IC bare chip 3 is disposed on the surface of the multilayer printed wiring board 2, that is, on the first insulating layer 20.

In the multilayer printed wiring board 2 according to the present embodiment, the wiring pattern 10 has a ground coplanar strip line structure. Widths of signal lines and distances between the signal lines and ground lines are determined in such a manner that a characteristic impedance of the multilayer printed wiring board 2 becomes a predetermined value. The predetermined value is, for example, 50Ω.

An exemplary process of manufacturing the integrated circuit mounted board 1 according to the present embodiment will be described with reference to FIG. 5A to FIG. 5E. During a process illustrated in FIG. 5A, the base substrate 8 is formed in a manner similar to the process illustrated in FIG. 3A.

During a process illustrated in FIG. 5B and FIG. 5C, a cavity is provided at a predetermined region of the second insulating layer 20 and the third insulating layer in the base substrate 8, for example, with a laser device. The cavity penetrates the base substrate 8 from a surface of the base substrate 8 on an opposite side from the electrodes 10a and 10b to a surface of the second insulating layer 20 adjacent to the first insulating layer 20. Then, the base substrate 8 and the metal base 30 are bonded to each other in such a manner that the copper portion 6 is fitted into the cavity. In the present embodiment, the copper portion 6 is opposite to all the electrodes 10a and 10b. That is, one under region being opposite to all the electrodes 10a and 10b is provided in the insulating layers 20.

During a process illustrated in FIG. 5D, the chip part 4 such as, for example, the capacitor and the resistor is soldered on a predetermined portion of the signal lines on the surface of the multilayer printed wiring board 2. The multilayer printed wiring board 2 is disposed on the heat stage heated at a temperature from 150° C. to 200° C. The IC bare chip 3 is disposed face-down, and the bumps formed on the pads 3a and 3b are directly fusion-bonded to the electrodes 10a and 10b on the surface of the multilayer printed wiring board 2, that is, on the first insulating layer 20.

In the above-described manufacturing method, the IC bare chip 3 can be electrically coupled with the multilayer printed wiring board 2 without the conductive wires 5. Thus, a mounting area of the IC bare chip 3 can be reduced, and a length of coupling portions between the IC bare chip 3 and the multilayer printed wiring board 2 can be reduced. Therefore, an electrical property of the integrated circuit mounted board 1 can be improved.

Other Embodiments

Although the present invention has been fully described in connection with the exemplary embodiments thereof with reference to the accompanying drawings, it is to be noted that various changes and modifications will become apparent to those skilled in the art.

For example, as illustrated in FIG. 6A to FIG. 6C and FIG. 7A to FIG. 7C, a thickness of the first insulating layer 20 may be less than a thickness of the insulating layer 20 other than the first insulating layer 20.

By reducing the thickness of the first insulating layers 20, a dispersion of the ultrasonic wave and the load during the thermal fusion bonding can be restricted when the integrated circuit mounted board 1 is manufactured. Thus, the IC bare chip 3 can be electrically coupled with the multilayer printed wiring board 2 with certainty.

In each of the integrated circuit mounted board 1 according to the above-described embodiments, the wiring pattern 10 have the microstrip line structure or the ground coplanar strip line structure, as examples. The wiring pattern 10 may also have a coplanar strip line structure.

In a case where the wiring pattern 10 has a microstrip line structure, as illustrated in FIG. 8A to FIG. 8C and FIG. 9A to FIG. 9C, on a surface of the first insulating layer 20 on which the electrodes 10a and 10b and the ground pads 10c-10f are formed, which corresponds to a first surface, a strip line pattern layer may be formed, on a surface of the first insulating layer 20 adjacent to the second insulating layer 20, which corresponds to a second surface, a ground pattern layer may be formed only at a portion corresponding to the under region required for the copper portions 6 and the via plugs 7, on a surface of the second insulating layer being opposite from the first insulating layer 20, which corresponds to a third surface, a ground pattern layer may be formed at a region other than the under regions and the recess portions 2a. The ground pattern layer disposed on the second surface and the ground pattern layer disposed on the third surface may be coupled through the via plugs 7 penetrating through the second insulating layer 20.

When the microstrip line structure has a strip line width W, the insulating layers 20 have a relative permittivity $\in$r, and the multilayer printed wiring board 2 has a characteristic impedance Z, a thickness "h" of two insulating layers 20 may be set based on following formula (I).

$$Z=(120\pi/\in\!e\!f\!f^{1/2})/\{W/h+1.393+\ln(W/h+1.444)\} \quad (1)$$

Where, $\in\!e\!f\!f=(\in r+1)/2+(\in r-1)/2(1+12\,h/W)^{1/2}$
For example, when Z=50Ω, $\in$r=3.5, and W=300 μm, h≈135 μm. Thus, a thickness of each of the insulating layers 20 may be about 67.5 μm.

The integrated circuit mounted board 1 having the above-described structure is substantially similar to a case where the thickness of the first insulating layer 20 is reduced only at a region corresponding to the under region. Therefore, the IC bare chip 3 can be electrically coupled with the multilayer printed wiring board 2 with certainty, and an influence to the characteristic impedance can be reduced.

In each of the integrated circuit mounted boards 1 according to the above-described embodiments, the metal base 30 is configured to be used as a heat sink. The metal base 30 may also be configured to be used as a slot antenna. The metal base 30 may be made of metal including copper or the metal base 30 may be made of metal other than copper.

In each of the integrated circuit mounted boards 1 according to the above-described embodiments, one IC bare chip 3 is mounted. Each of the integrated circuit mounted boards 1 may be a multichip module in which a plurality of IC bare chips 3 is mounted. Each of the integrated circuit mounted boards 1 may include a single layer printed wiring board instead of the multilayer printed wiring board 2.

Figure 10A:
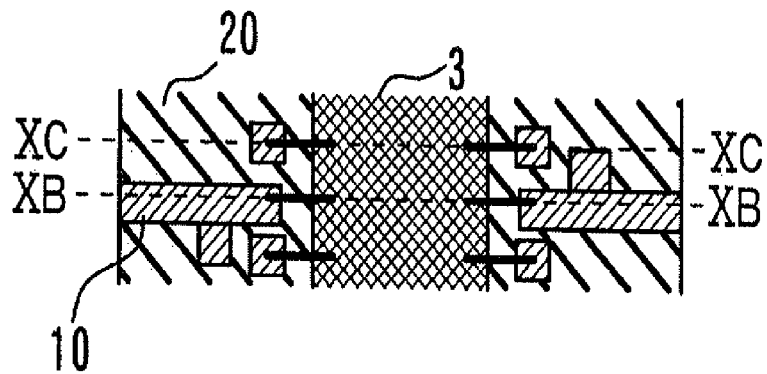
FIG. 10A is a diagram illustrating a top view of the integrated circuit mounted board according to another embodiment of the present invention.
Figure 10B:
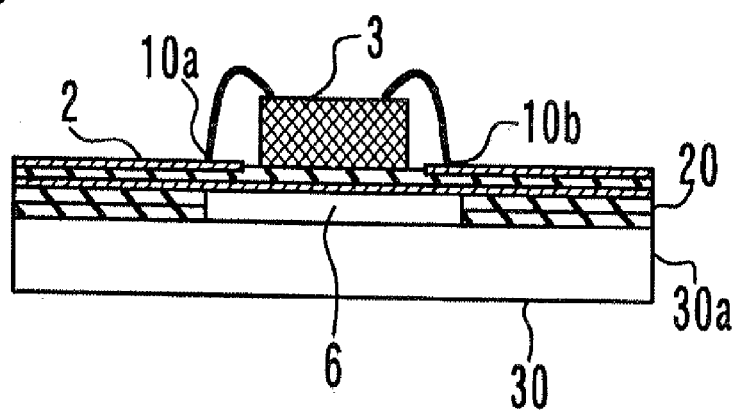
FIG. 10B is a diagram illustrating a cross-sectional view of the integrated circuit mounted board taken along line XB-XB in FIG. 10A.
Figure 10C:
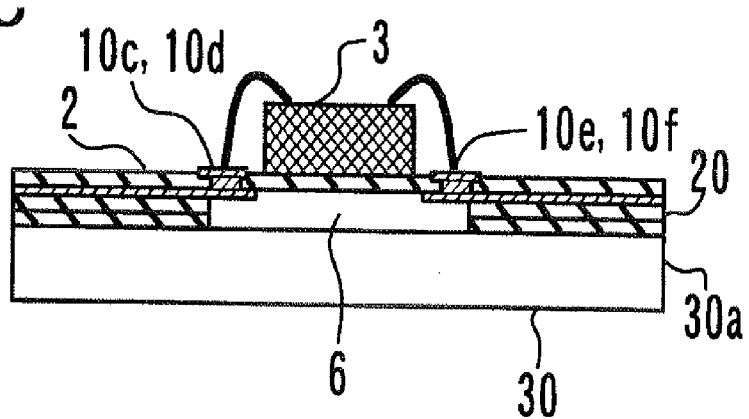
FIG. 10C is a diagram illustrating a cross-sectional view of the integrated circuit mounted board taken along line XC-XC in FIG. 10A.

In the integrated circuit mounted board 1 according to the first embodiment, the IC bare chip 3 is mounted on the recess portions 2a of the multilayer printed wiring board 2, and the plurality of copper portions 6 is bonded in the insulating layers 20. As illustrated in FIG. 10A to FIG. 10O, the IC bare chip 3 may also be disposed on a surface of the multilayer printed wiring board 2, and one copper portion 6 may be fitted in the insulating layers 20 so as to opposite the IC bare chip 3, the electrodes 10a and 10b, and the ground pads 10c-10f.

What is claimed is:

1. An integrated circuit mounted board comprising a printed wiring board and an integrated circuit bare chip mounted on the printed wiring board, wherein:
   the printed wiring board includes a metal base, an insulating member made of an insulating material and disposed on the metal base, and a wiring pattern disposed on the insulating member;
   the wiring pattern includes an electrode part to which the integrated circuit bare chip is electrically coupled;
   the insulating member includes an under region being opposite to the electrode part;
   the metal base includes a metal substrate and a metal portion protruding from the metal substrate;
   the metal portion is buried in the under region of the insulating member;
   the insulating member includes a plurality of insulating layers;
   the wiring pattern includes a plurality of wiring layers;
   each of the plurality of wiring layers is disposed on one of the plurality of insulating layers;
   the plurality of insulating layers includes a first insulating layer on which the electrode part is disposed and a second insulating layer disposed on an opposite side of the first insulating layer from the electrode part; and
   the metal portion penetrates the plurality of insulating layers from a surface of the plurality of insulating layers adjacent to the metal base to a surface of the second insulating layer adjacent to the first insulating layer.

2. The integrated circuit mounted board according to claim 1, wherein the insulating material includes a thermoplastic resin.

3. The integrated circuit mounted board according to claim 1, wherein:
   the electrode part includes a plurality of electrodes;
   the under region includes a plurality of regions; and
   each of the plurality of regions is opposite to one of the plurality of electrodes.

4. The integrated circuit mounted board according to claim 1, wherein
   a thickness of the first insulating layer is less than a thickness of an insulating layer in the plurality of insulating layers other than the first insulating layer.

5. The integrated circuit mounted board according to claim 1, wherein:
   the printed wiring board further includes a via plug penetrating through the second insulating layer;
   the wiring pattern has a microstrip line structure and the plurality of wiring layers includes a strip line pattern layer and two ground pattern layers;
   the first insulating layer has a first surface on which the electrode part is disposed and a second surface adjacent to the second insulating layer;
   the second insulating layer has a third surface on an opposite side of from the first insulating layer;
   the strip line pattern layer is disposed on the first surface;
   one of the ground pattern layers is disposed only at a portion of the second surface corresponding to the under region;
   the other one of the ground pattern layers is disposed on the third surface; and
   the ground pattern layer disposed on the second surface is electrically coupled with the ground pattern layer disposed on the third surface through the via plug.

6. The integrated circuit mounted board according to claim 1, wherein the insulating material includes a supplementing material so that the insulating member has a linear expansion coefficient similar to a linear expansion coefficient of the wiring pattern, and
   the metal substrate and the metal portion are made of a material having a linear expansion coefficient similar to the linear expansion coefficient of the wiring pattern.

* * * * *